(12) United States Patent
Byrd et al.

(10) Patent No.: US 11,239,377 B2
(45) Date of Patent: Feb. 1, 2022

(54) OPTOELECTRONIC MODULE PACKAGE

(71) Applicant: ROCKLEY PHOTONICS LIMITED, London (GB)

(72) Inventors: Gerald Cois Byrd, Shadow Hills, CA (US); Thomas Pierre Schrans, Temple City, CA (US); Chia-Te Chou, Pasadena, CA (US); Arin Abed, Glendale, CA (US); Omar James Bchir, San Marcos, CA (US)

(73) Assignee: Rockley Photonics Limited, London (GB)

( * ) Notice: Subject to any disclaimer, the term of this patent is extended or adjusted under 35 U.S.C. 154(b) by 253 days.

(21) Appl. No.: 16/056,340

(22) Filed: Aug. 6, 2018

(65) Prior Publication Data

US 2019/0044002 A1 Feb. 7, 2019

Related U.S. Application Data

(60) Provisional application No. 62/542,074, filed on Aug. 7, 2017.

(51) Int. Cl.
| | |
|---|---|
| *H01L 23/498* | (2006.01) |
| *H01L 31/02* | (2006.01) |
| *H01L 23/532* | (2006.01) |
| *H05K 1/02* | (2006.01) |
| *G02B 6/42* | (2006.01) |

(52) U.S. Cl.
CPC ........ *H01L 31/02019* (2013.01); *G02B 6/428* (2013.01); *H01L 23/49833* (2013.01); *H01L 23/49838* (2013.01); *H01L 23/53233* (2013.01); *H01L 31/02005* (2013.01); *H05K 1/0209* (2013.01); *G02B 6/4269* (2013.01); *H01L 2224/48091* (2013.01)

(58) Field of Classification Search
CPC . H01L 2224/48091; H01L 2924/00014; H01L 23/49833; H01L 23/49838; H01L 23/53233; H01L 31/02005; H01L 31/02019; H01L 23/498; H01L 23/532; H01L 31/02; G02B 6/4269; G02B 6/428; H05K 1/0209; H05K 1/02
See application file for complete search history.

(56) References Cited

U.S. PATENT DOCUMENTS

| | | |
|---|---|---|
| 2003/0123816 A1 | 7/2003 | Steinberg et al. |
| 2004/0062491 A1* | 4/2004 | Sato ............... G02B 6/4266 385/88 |

(Continued)

FOREIGN PATENT DOCUMENTS

EP 0 638 829 A1 2/1995

OTHER PUBLICATIONS

U.K. Intellectual Property Office Search Report, dated Jan. 29, 2019, for Patent Application No. GB1812745.6, 6 pages.

*Primary Examiner* — Matthew G Landau
*Assistant Examiner* — Dmitriy Yemelyanov
(74) *Attorney, Agent, or Firm* — Lewis Roca Rothgerber Christie LLP

(57) ABSTRACT

An optoelectronic module. In some embodiments, the optoelectronic module includes: a substrate; a digital integrated circuit, on an upper surface of the substrate; and a frame, secured in a pocket of the substrate. The pocket is in a lower surface of the substrate, and the substrate includes an insulating layer, and a plurality of conductive traces.

13 Claims, 14 Drawing Sheets

(56) References Cited

U.S. PATENT DOCUMENTS

| | | | |
|---|---|---|---|
| 2005/0058408 A1* | 3/2005 | Colgan | G02B 6/4214 |
| | | | 385/89 |
| 2009/0022500 A1 | 1/2009 | Pinguet et al. | |
| 2012/0228650 A1* | 9/2012 | Chern | H01L 24/97 |
| | | | 257/88 |
| 2012/0241795 A1 | 9/2012 | Chang et al. | |
| 2014/0203175 A1* | 7/2014 | Kobrinsky | H01L 24/83 |
| | | | 250/214.1 |
| 2015/0219935 A1* | 8/2015 | Guzzon | G02F 1/025 |
| | | | 385/3 |
| 2015/0358083 A1* | 12/2015 | Doerr | G02B 6/12004 |
| | | | 398/139 |
| 2016/0013866 A1* | 1/2016 | Doerr | G02B 6/42 |
| | | | 398/139 |
| 2016/0085038 A1* | 3/2016 | Decker | G02B 6/428 |
| | | | 385/14 |
| 2016/0178915 A1 | 6/2016 | Mor et al. | |
| 2017/0194309 A1* | 7/2017 | Evans | G02B 6/12004 |

\* cited by examiner

OPTOELECTRONIC MODULE PACKAGE

CROSS-REFERENCE TO RELATED APPLICATION(S)

The present application claims priority to and the benefit of U.S. Provisional Application No. 62/542,074, filed Aug. 7, 2017, entitled "OPTOELECTRONIC MODULE PACKAGE", the entire content of which is incorporated herein by reference.

FIELD

One or more aspects of embodiments according to the present invention relate to optoelectronic modules, and more particularly to a system and method of packaging for an optoelectronic module.

BACKGROUND

In the design of an optoelectronic module including photonic integrated circuits (that may convert optical signals to electrical signals, and vice versa) and electronic (or electrical) integrated circuits (that may perform analog signal processing functions and/or digital switching and control functions), various challenges may arise, including ensuring that all components of the module operate within a respective acceptable temperature range, providing electrical connections to all of the components that require them, and the like.

SUMMARY

According to an embodiment of the present invention, there is provided an optoelectronic module, including: a substrate; a digital integrated circuit, on an upper surface of the substrate; and a frame, secured in a pocket of the substrate, the pocket being in a lower surface of the substrate, the frame being composed of a material having a thermal conductivity greater than 10 W/m/K, the substrate including: an insulating layer, and a plurality of conductive traces.

In one embodiment, the substrate further includes a copper layer on a surface of the pocket parallel to the lower surface of the substrate.

In one embodiment, the optoelectronic module further includes: a photonic integrated circuit, and an analog integrated circuit, connected to the photonic integrated circuit, and to the digital integrated circuit.

In one embodiment, the analog integrated circuit is connected to the digital integrated circuit through the substrate In one embodiment, the optoelectronic module further includes: a carrier secured to an upper surface of the frame, the photonic integrated circuit and the analog integrated circuit being secured to an upper surface of the carrier, the carrier including an insulating layer and a plurality of thermal vias forming a thermal path from the analog integrated circuit to the frame In one embodiment, the photonic integrated circuit is connected to the analog integrated circuit by wire bonds, and the analog integrated circuit is connected to the substrate by wire bonds.

In one embodiment, the optoelectronic module further includes a heater, in or on the photonic integrated circuit, wherein a total thermal conductivity between the photonic integrated circuit and the frame is less than 10 mW/K.

In one embodiment, the carrier includes a plurality of conductive traces, the heater is connected to the carrier by wire bonds, and the carrier is connected to the substrate by wire bonds.

In one embodiment, the optoelectronic module further includes a heater patterned in metal traces on the carrier.

In one embodiment, the optoelectronic module further includes an optical fiber, wherein: the photonic integrated circuit has a V-groove, and an end of the optical fiber is in the V-groove.

In one embodiment, the optoelectronic module further includes a carrier secured to an upper surface of the frame, the optoelectronic module including an optoelectronic subassembly including: the photonic integrated circuit; the analog integrated circuit; the carrier; and an optical fiber, coupled to an optical waveguide on the photonic integrated circuit, the optoelectronic subassembly having a plurality of contact pads for establishing electrical connections between the analog integrated circuit and test equipment probes, the optoelectronic subassembly being configured to be separately testable by supplying power to the optoelectronic subassembly through one or more of the contact pads and sending data to and and/or receiving data from the optoelectronic subassembly through one or more of the contact pads.

In one embodiment, the digital integrated circuit is secured and connected to the substrate by a first array of contacts, and the lower surface of the substrate has a second array of contacts.

In one embodiment, the second array of contacts has a coarser pitch than the first array of contacts. In one embodiment, the optoelectronic module further includes a lid, on, and in thermal contact with, an upper surface of the digital integrated circuit, the lid including a material having a thermal conductivity of at least 10 W/m/K.

According to an embodiment of the present invention, there is provided an optoelectronic module, including: a substrate including an insulating layer; an electronic integrated circuit, on an upper surface of the substrate; and a photonic integrated circuit, an upper surface of the substrate having a pocket, the substrate having a copper layer on a bottom surface of the pocket, the photonic integrated circuit being secured to the copper layer.

In one embodiment, the electronic integrated circuit overhangs the pocket and the photonic integrated circuit, and a first array of contacts on a lower surface of the electronic integrated circuit forms connections from the electronic integrated circuit to: the upper surface of the substrate, and an upper surface of the photonic integrated circuit.

In one embodiment, the optoelectronic module further includes a heater, in or on the photonic integrated circuit.

In one embodiment, the substrate further includes a plurality of conductive traces, and the photonic integrated circuit is connected to the conductive traces by wire bonds.

In one embodiment, the electronic integrated circuit is a digital integrated circuit.

In one embodiment, the optoelectronic module further includes an analog integrated circuit, on an upper surface of the photonic integrated circuit, the analog integrated circuit being connected to the photonic integrated circuit by a second array of contacts.

BRIEF DESCRIPTION OF THE DRAWINGS

These and other features and advantages of the present disclosure will be appreciated and understood with reference to the specification, claims, and appended drawings wherein:

DETAILED DESCRIPTION

The detailed description set forth below in connection with the appended drawings is intended as a description of exemplary embodiments of an optoelectronic module package provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1:
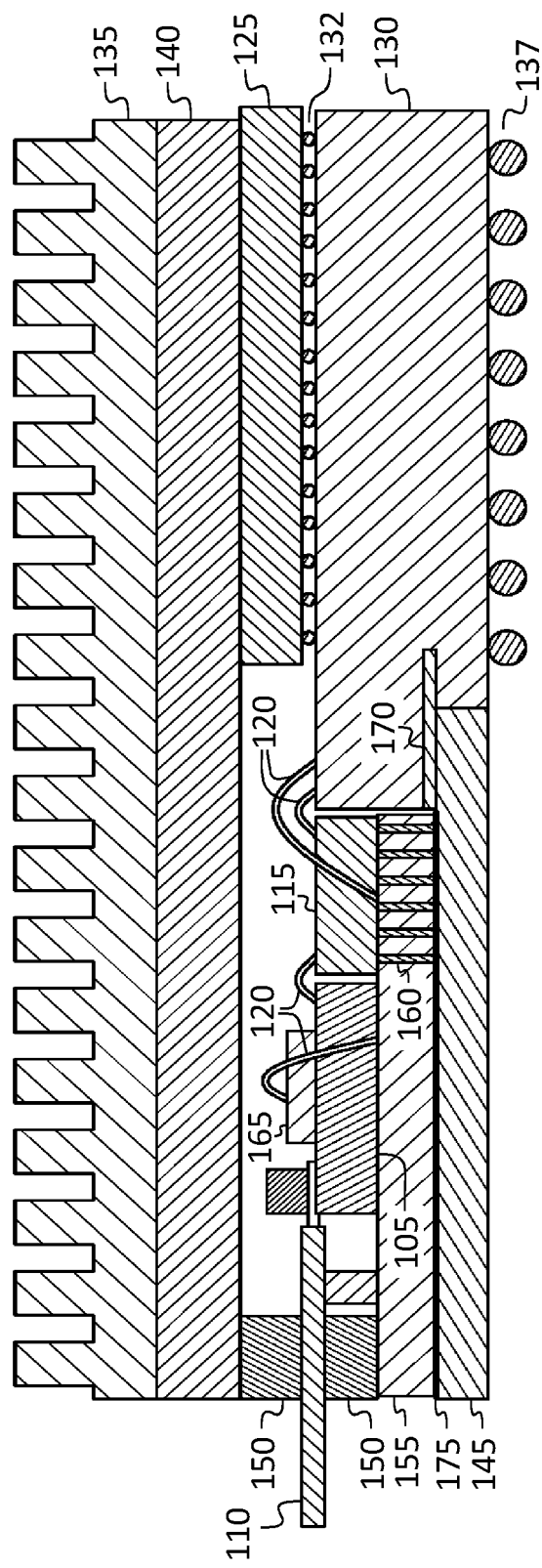
FIG. 1 is a schematic cross-sectional view of a portion of an optoelectronic module, according to an embodiment of the present disclosure.

Referring to FIG. 1, in one embodiment a photonic integrated circuit (PIC) 105 is connected to the exterior of an optoelectronic module package by one or more optical fibers 110 and to one or more analog application-specific integrated circuits (ASICs) 115 by wire bonds 120. Each optical fiber 110 may be set in a V-groove fabricated in the PIC 105 and aligned with a waveguide or other optical structure on the PIC 105. Each PIC 105 may include a waveguide having transverse dimensions of approximately 10 microns at a point at which light couples into the waveguide from the fiber 110, or from the fiber 110 into the waveguide. A mode adapter, e.g., a taper, may guide the light and transform the optical mode to one that propagates in a waveguide having transverse dimensions of approximately 3 microns. The 3 micron waveguide may be used to guide the light to a photodetector, or from a modulator. Further mode adapters (e.g., at a modulator) may be used to effect further changes in the size or shape of the optical mode, e.g., to enable light to propagate through a modulator fabricated on a waveguide with smaller transverse dimension (for improved modulator performance). The PIC 105 may include an array of photodetectors for converting optical signals (received through a first subset of the optical fibers) to electrical signals, or an array of modulators for converting electrical signals to optical signals (to be transmitted through a second subset of the optical fibers). The analog ASICs 115 may act as interface circuits between a digital ASIC (e.g., a CMOS digital integrated circuit) 125 and the PICs 105. Each analog ASIC 115 may include, for example, transimpedance amplifiers for amplifying the signals from photodiodes in the PIC 105 or driver circuits for driving modulators in the PIC 105.

The analog ASICs 115 are connected by wire bonds 120 to a substrate 130. The digital ASIC 125 is connected and secured to the substrate 130 by a flip chip array 132, i.e., an array of flip chip bumps (or an array of contacts), which may be solder bumps, solder balls (as illustrated), Cu pillars, Au—Au interconnects, or the like. In the case of solder bumps or balls, the solder bumps or balls may be heated during assembly, in a reflow process, to form solder joints between the substrate 130 and the digital ASIC 125. The substrate 130 may be an organic substrate (e.g., a fiberglass-reinforced plastic substrate) including conductive traces. The conductive traces in the substrate 130 (together with the wire bonds 120) form connections between the analog ASIC 115 and the digital ASIC 125. The lower surface of the substrate 130 may (like the digital ASIC 125) also have an array of contacts 137, which may be used to connect the optoelectronic module to a printed circuit board, which may be referred to as a "system printed circuit board". The pitch of the array of contacts 137 on the substrate 130 may be relatively coarse (e.g., 0.4 mm, 0.5 mm, or 0.8 mm) to make possible the use of the system printed circuit board fabricated with a relatively low cost process. The array of contacts 137 on the substrate 130 may, for example, be a land grid array, a pin grid array, or a ball grid array.

The digital ASIC 125 is in thermal contact with a heat sink 135, e.g., through a thermally conductive (e.g., copper) lid 140. A frame 145, and a grommet 150 that seals around the fibers, protect the module's internal components. Each analog ASIC 115 is mounted on a carrier 155 with one or more corresponding PICs 105. Each carrier 155 may be composed of one or more layers of an organic material (e.g., fiberglass-reinforced plastic), and may be secured to the frame with a film of epoxy 175. The frame 145 may be composed of a thermally conductive material (e.g., a material having a thermal conductivity greater than 10 W/m/K, such as copper). The frame 145 may fit into a pocket in the lower surface of the substrate 130. The pocket may be formed by a laser ablation process during fabrication of the substrate 130; a copper stop layer 170, which may be a layer within a plurality of laminations of the substrate 130, may be used to control the depth of the pocket (by reflecting the laser light used to perform the laser ablation, once the laser reaches the stop layer).

Thermal vias 160, in the carrier 155, under the analog ASIC 115, may provide a thermally conductive path to the frame 145. Wire bonds 120 connect conductive traces in the substrate 130 to conductive traces in the carrier 155, which are in turn connected to a heater 165 on the PIC 105 by wire bonds 120, as shown. In this manner conductive paths, through which heater current may flow, are established from the system printed circuit board to the heater. In some embodiments the heater is integrated into the PIC 105 instead of being secured (e.g., bonded) to the top of the PIC 105; in such an embodiment wire bonds may supply heater current from the carrier 155 to wire bond pads on the PIC 105. Thermal vias are absent from the portion of the carrier 155 under the PIC 105, so that the heater may heat the PIC 105 to have a higher temperature than the frame 145. In some embodiments the heater is patterned in metal traces on the carrier 155 (e.g., on the top surface of the carrier 155). The total thermal conductivity between the PIC 105 and the frame, including thermal paths through the carrier 155, may be less than 10 mW/K. The temperature of the PIC 105 may be actively controlled (e.g., using a temperature sensor in the PIC 105 and a feedback circuit), to reduce temperature fluctuations in the PIC 105.

Figure 2A:
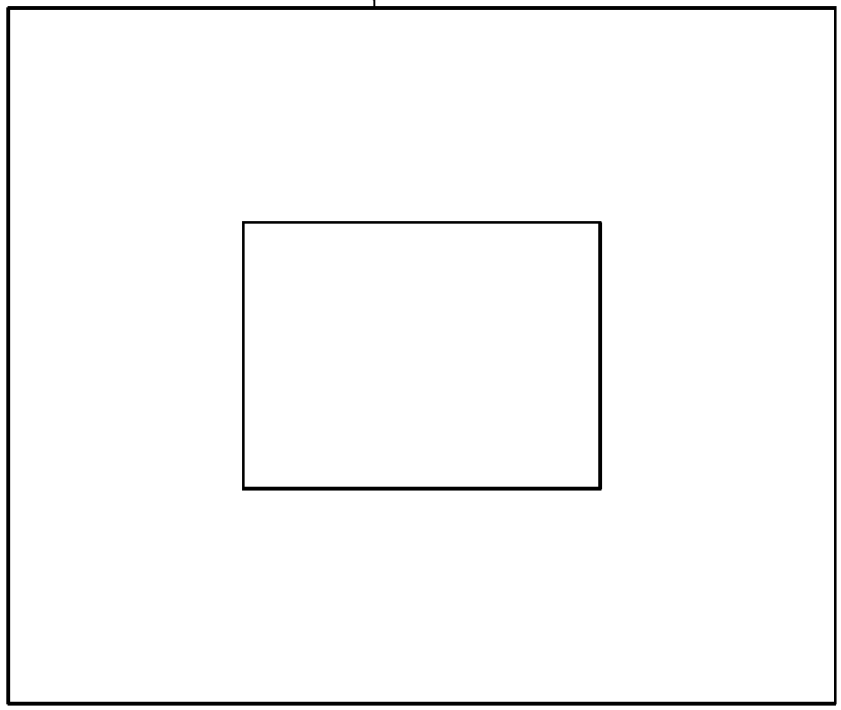
FIG. 2A is a top view of a frame, according to an embodiment of the present disclosure.
Figure 2B:
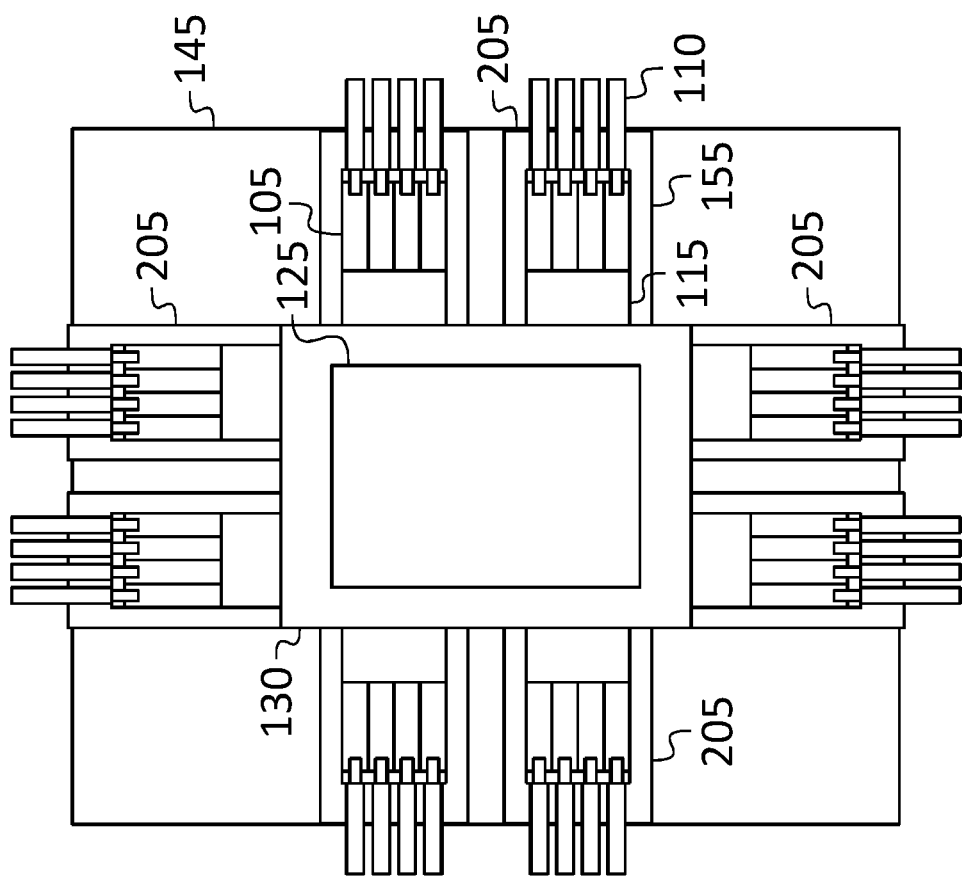
FIG. 2B is a schematic top view of a portion of an optoelectronic module, according to an embodiment of the present disclosure.
Figure 3:
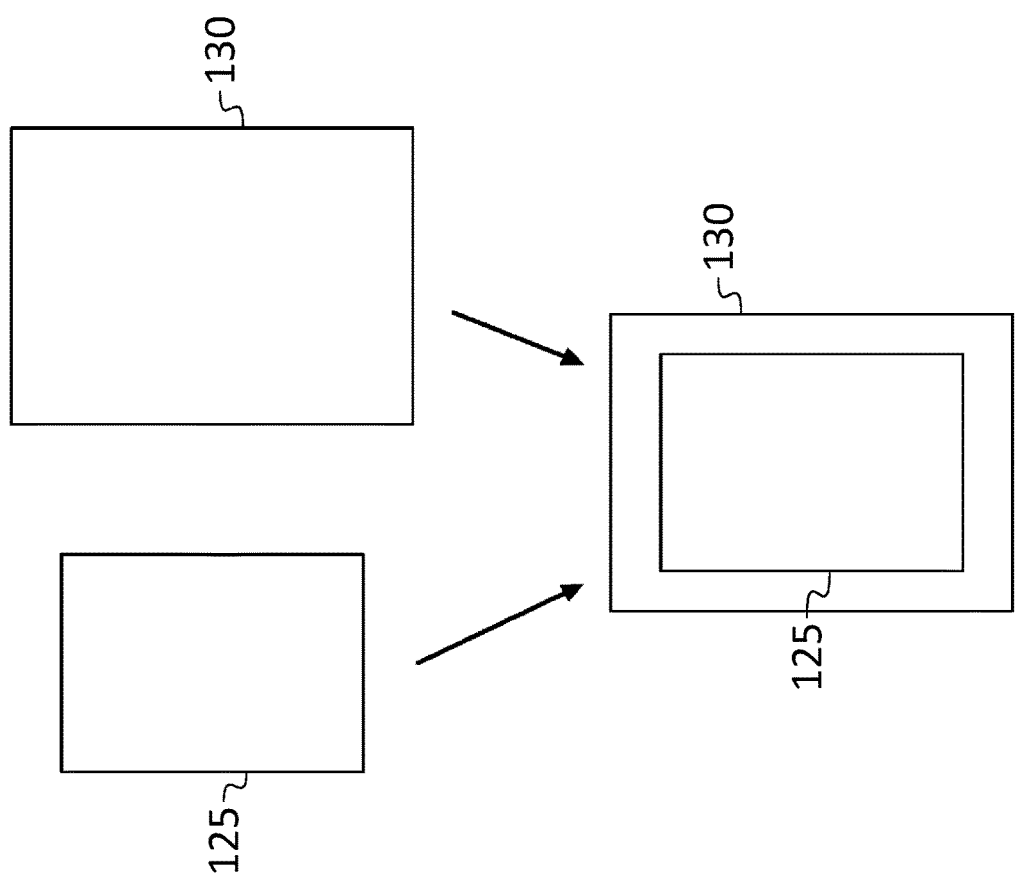
FIG. 3 is an assembly sequence diagram, according to an embodiment of the present disclosure.

Referring to FIGS. 2A and 2B, in some embodiments the frame has an interior cutout that is slightly smaller than the outer dimensions of the substrate, and the inner edge of the frame overlaps the outer edge of the substrate, and, as mentioned above and illustrated in FIG. 1, fits into a suitable pocket in the outer edge of the substrate. The assembly sequence may include bonding the substrate 130 (after the digital ASIC has been soldered to it (as illustrated in FIG. 3)) to the frame 145, and then installing optoelectronic (or "LightDriver") subassemblies 205 on the frame. Each optoelectronic subassembly 205 includes a plurality of PICS 105 (with fibers attached) and one or more analog ASICs 115.

Figure 4A:
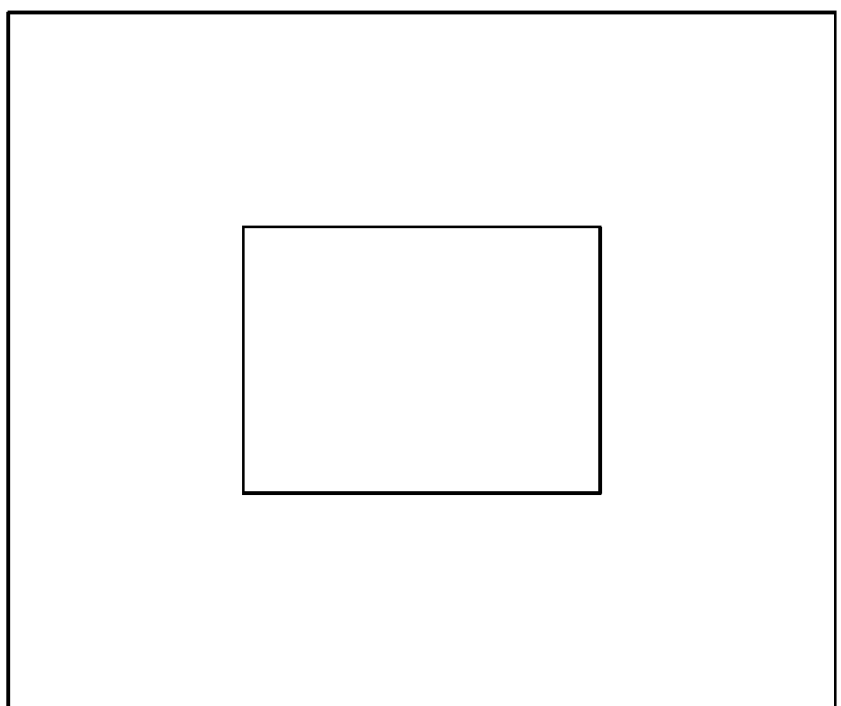
FIG. 4A is a top view of a frame, according to an embodiment of the present disclosure.
Figure 4B:
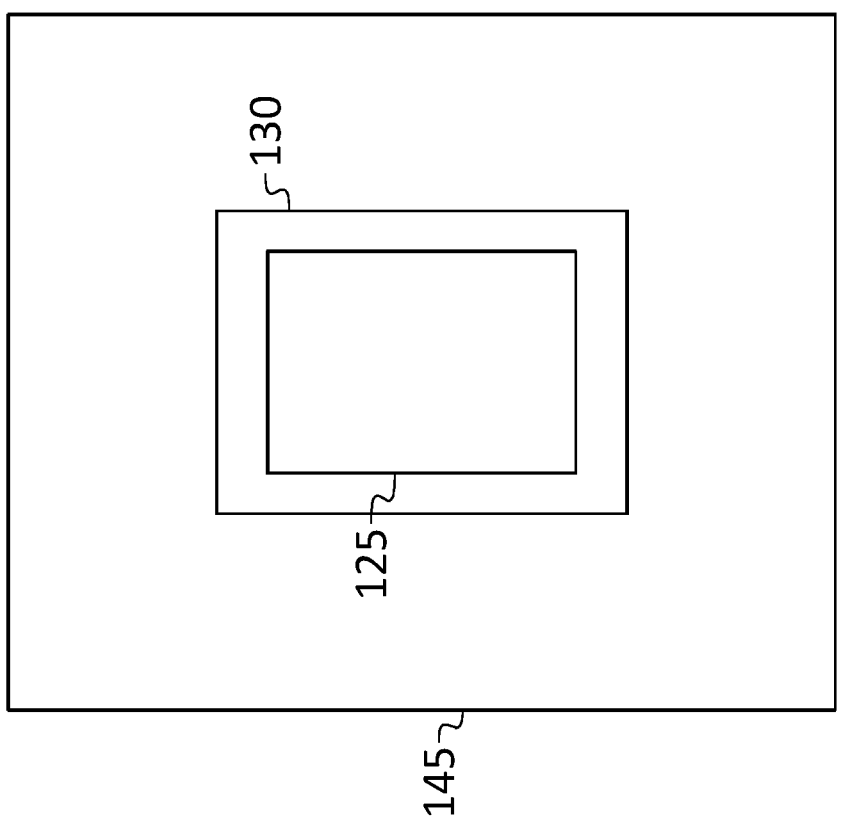
FIG. 4B is a schematic top view of a portion of an optoelectronic module, according to an embodiment of the present disclosure.
Figure 5:
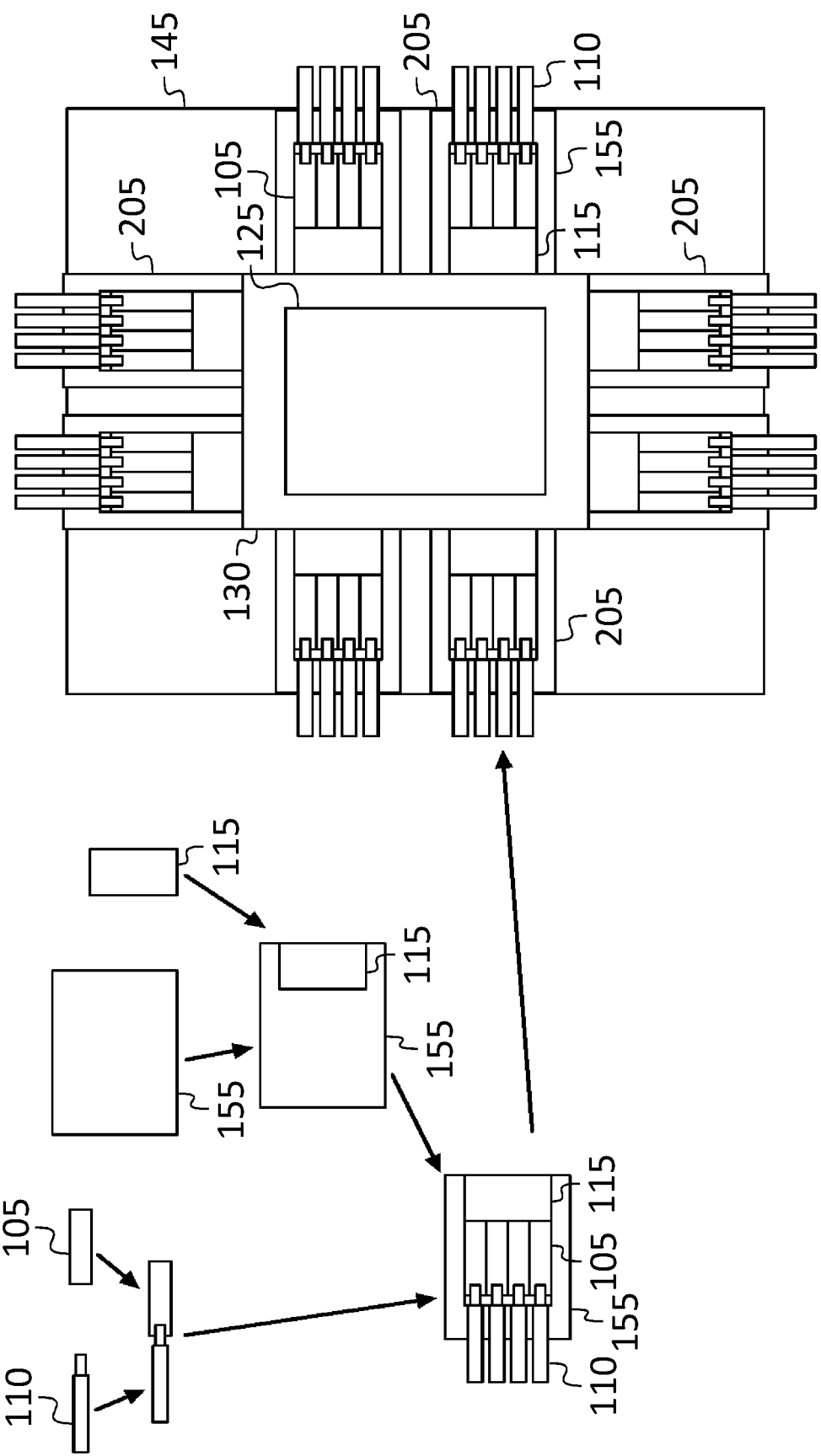
FIG. 5 is an assembly sequence diagram, according to an embodiment of the present disclosure.

FIGS. 4A and 4B show the bonding of the substrate 130 (with the digital ASIC 125 soldered to it) to the frame 145, and FIG. 5 shows the construction of an optoelectronic subassembly 205 and its installation on the frame 145. As shown in FIG. 5, a ribbon of fibers 110 may be connected to each PIC 105, and an analog ASIC 115 may be installed on each carrier 155; a plurality of fiber-PIC subassemblies may then be installed on the analog ASIC-carrier subassembly to form an optoelectronic subassembly 205. Each optoelectronic subassembly 205 may be separately testable, and may be tested before installation on the frame. For example, each optoelectronic subassembly 205 may have a plurality of contact pads (e.g., on the upper surface of the analog ASIC 115) for establishing electrical connections between the analog electronic integrated circuit and test equipment probes. The optical subassembly 205 may then be tested by supplying power to the optical subassembly 205 through one or more of the contact pads and sending data to and and/or receiving data from the optical subassembly through one or more of the contact pads. After testing, a plurality of optical subassemblies 205 (for which testing succeeded) may be secured to the frame 145 and wire bonded to the substrate 130. Optical subassemblies 205 for which testing fails may be discarded or reworked.

Figure 6A:
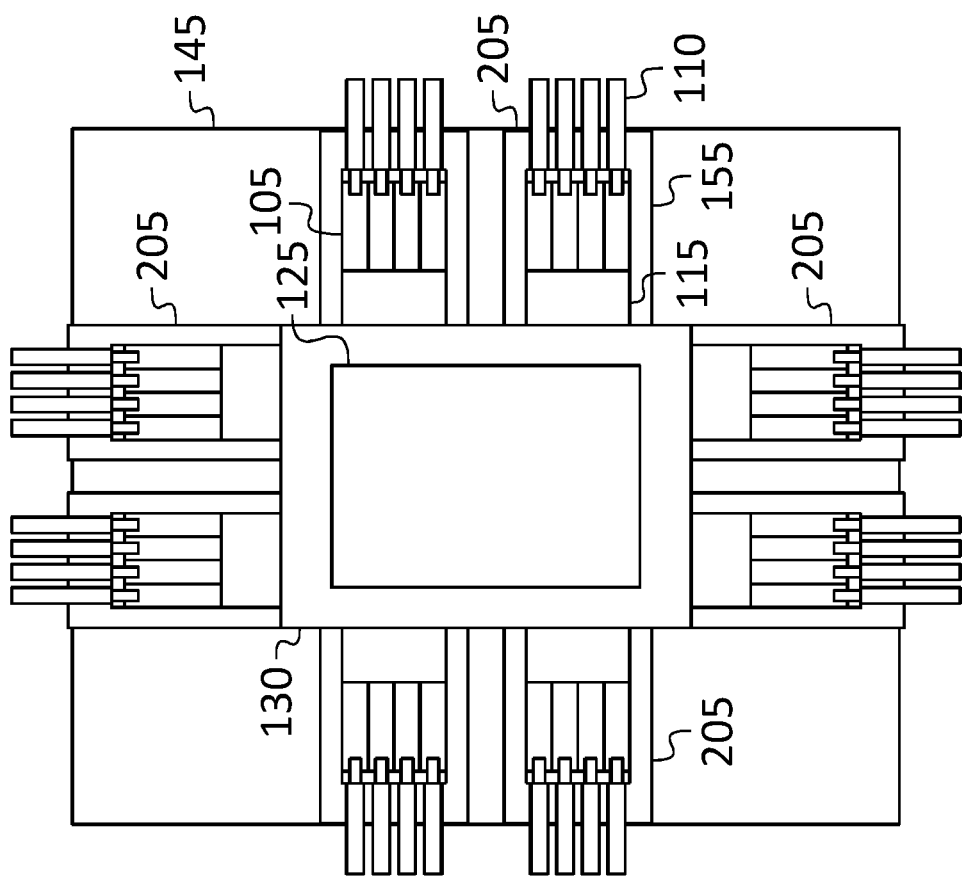
FIG. 6A is a schematic top view of a portion of an optoelectronic module, according to an embodiment of the present disclosure.
Figure 6B:
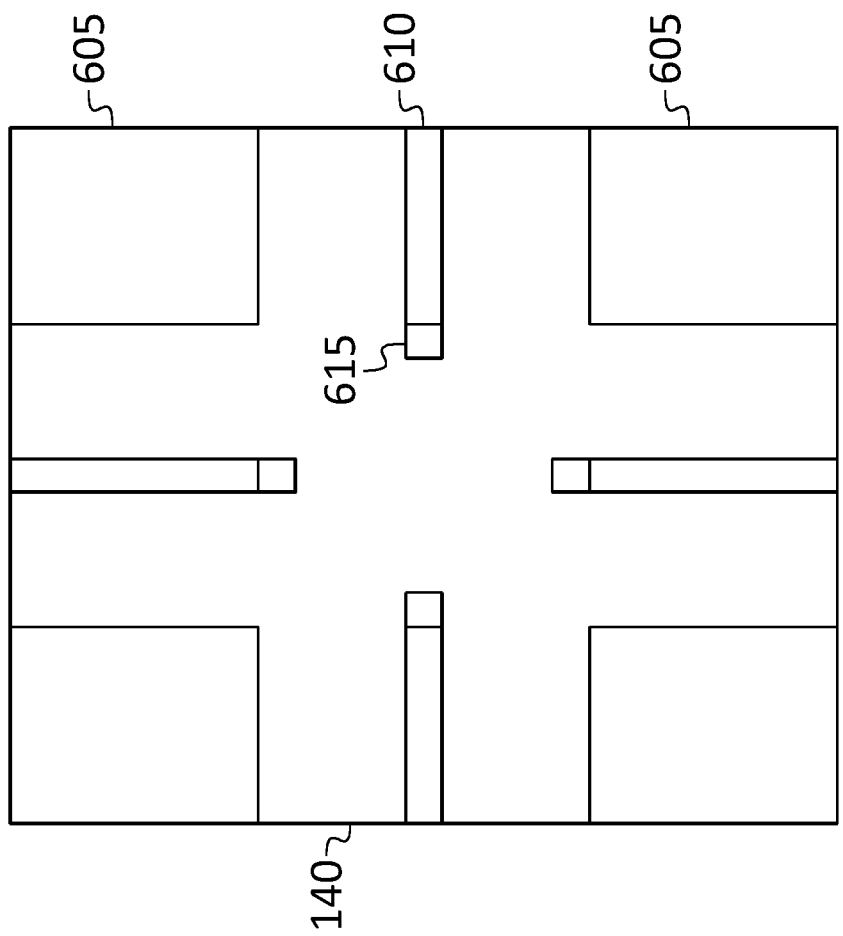
FIG. 6B is a bottom view of a lid, according to an embodiment of the present disclosure.
Figure 7A:
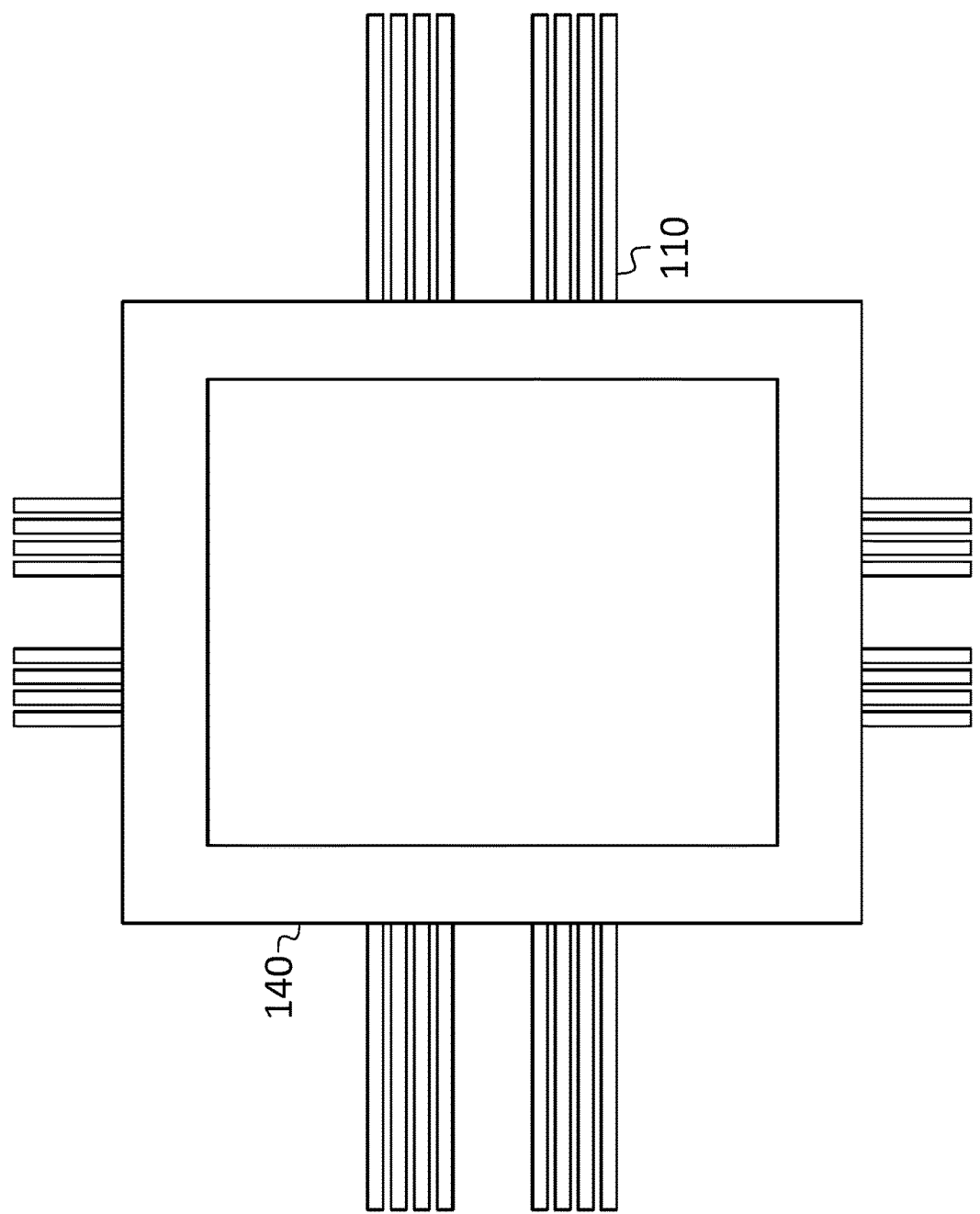
FIG. 7A is a schematic top view of an optoelectronic module, according to an embodiment of the present disclosure.
Figure 7B:
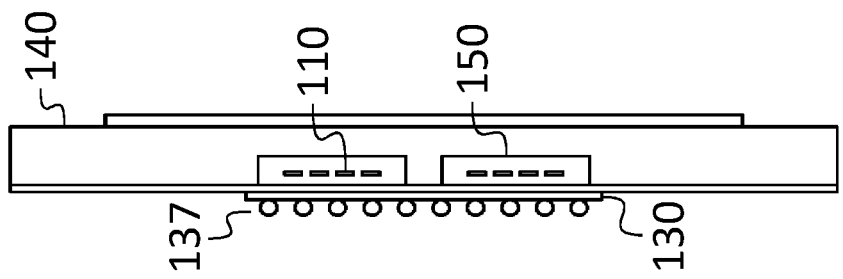
FIG. 7B is a schematic side view of an optoelectronic module, according to an embodiment of the present disclosure.

Referring to FIGS. 6A and 6B, in some embodiments a lid 140 (shown in FIG. 6B) is secured to the top of the subassembly constructed according to FIG. 5 (this subassembly is shown again in FIG. 6A). The lid 140 may include pedestals 605 extending down to the frame 145, and partitions 610 that separate adjacent optoelectronic subassemblies 205 to improve the electrical isolation between them. The presence of a partition 610 may be advantageous if of the two optoelectronic subassemblies 205 on either side of the partition, one is a receiving optoelectronic subassembly (i.e., a optoelectronic subassembly that receives data as optical signals) and the other is a transmitting optoelectronic subassembly (i.e., a optoelectronic subassembly that transmits data as optical signals). Each partition 610 may have a recess 615 at its innermost end that may overlap the substrate 130 to form an electrical contact with the substrate 130, further improving the shielding the partition 610 provides. The pedestal 605 at each corner of the lid 140 provides a thermal path between the frame and the lid 140. FIGS. 7A and 7B show a top view and side view of the complete module, respectively. The heat sink 135 (FIG. 1) may be secured (e.g., clamped) to the lid 140 after the module is installed on the system printed circuit board.

Figure 8:
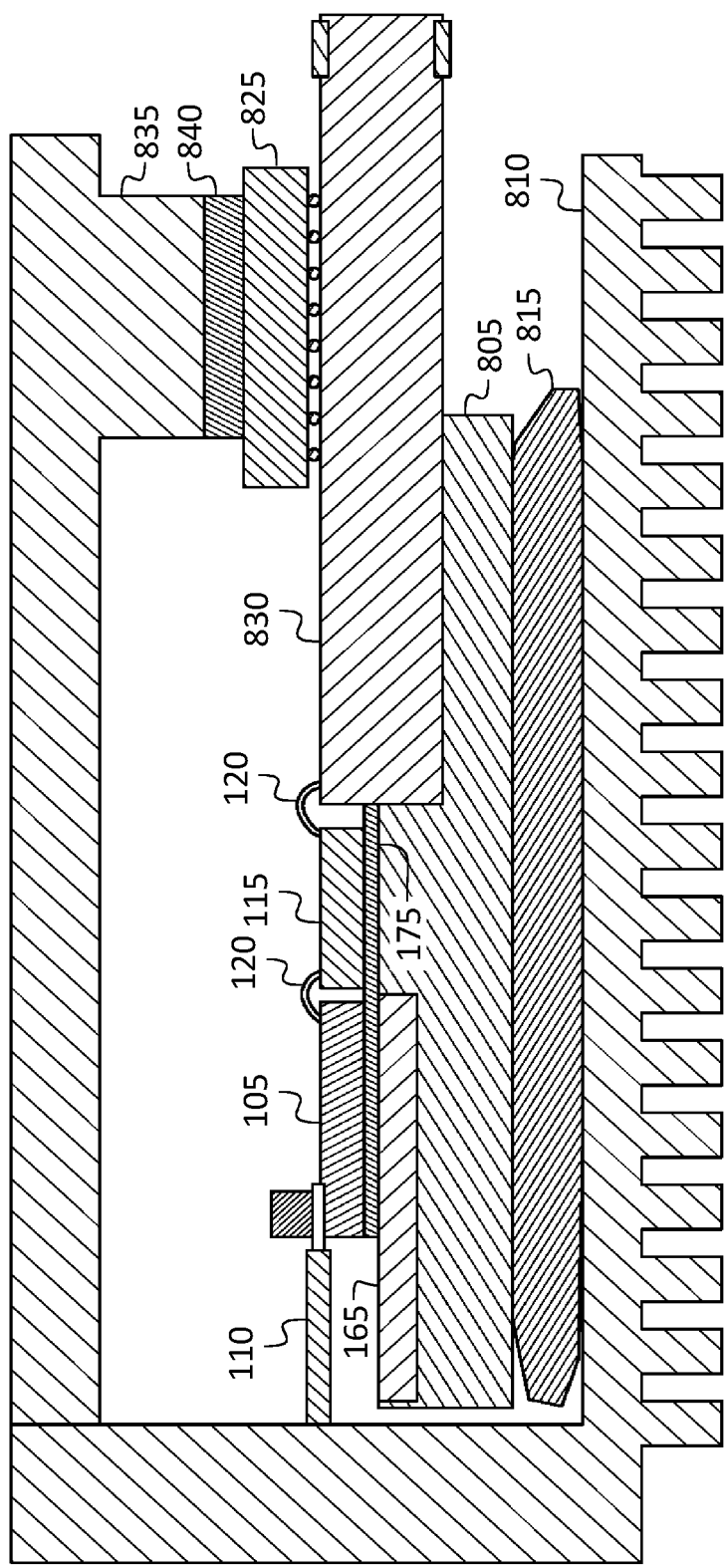
FIG. 8 is a schematic cross-sectional view of a portion of an optoelectronic module, according to an embodiment of the present disclosure.

FIG. 8 shows an alternate embodiment in which a metal carrier (e.g., a copper carrier) 805 supports the PIC 105 and the analog ASIC 115. The metal carrier 805 is secured to, and in thermal contact with, a heat sink 810 through a thermal pad 815. A heater 165 fits into a pocket in the metal carrier 805, and a film of epoxy 175 secures the PIC 105 and the analog ASIC 115 to the heater 165 and to the metal carrier 805, respectively. One or more low-power integrated circuits 825 may be installed on a transceiver printed circuit board 830, secured in a pocket in the metal carrier 805. A pedestal 835 and a thermal interface material 840 may provide a thermal path for heat dissipated in the low-power integrated circuits 825.

Figure 9:
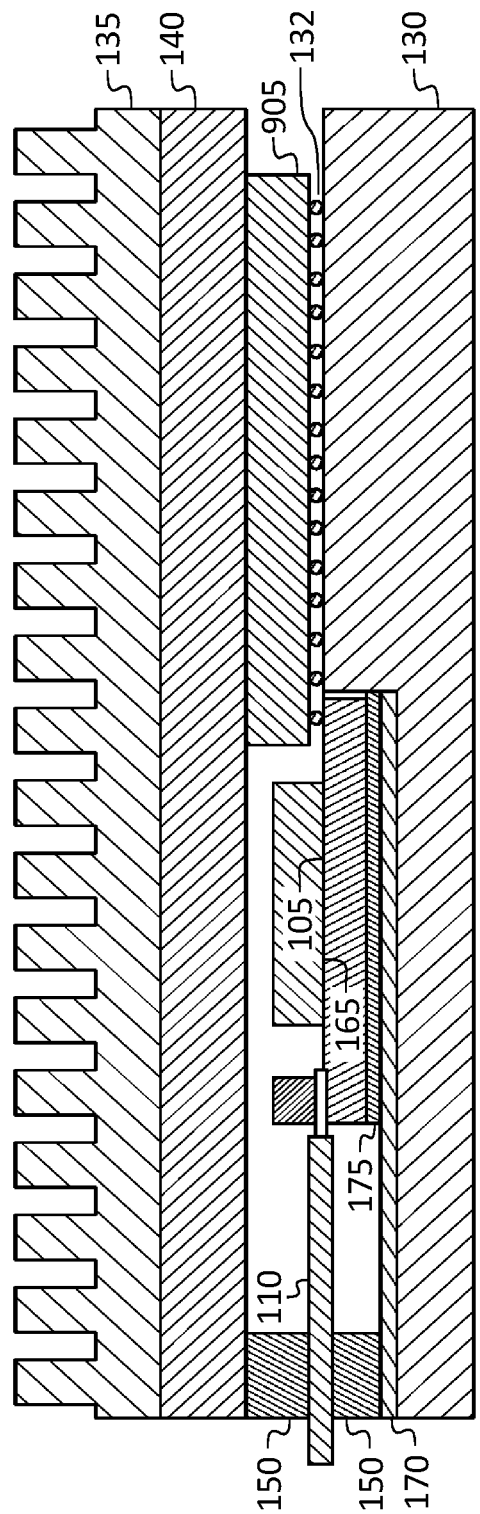
FIG. 9 is a schematic cross-sectional view of a portion of an optoelectronic module, according to an embodiment of the present disclosure.

FIG. 9 shows an embodiment in which a pocket in a substrate is formed by laser milling, as in the embodiment of FIG. 1, using a copper stop layer 170, and the PIC 105 is secured to the bottom of the pocket with a film of epoxy 175. In the embodiment of FIG. 9, the electronic ASIC 905 includes both digital circuits and the analog circuits that in other embodiments (e.g., in the embodiment of FIG. 1) are in analog ASICs 115. As used herein, an "electronic integrated circuit" or an "electronic ASIC" may be an analog integrated circuit, a digital integrated circuit, or an integrated circuit containing both analog and digital circuits (like the electronic ASIC 905 of FIG. 9). The electronic ASIC 905 overhangs the pocket and the PIC 105 and is connected by a flip chip array 132 to both the substrate 130 and the PIC 105.

Figure 10:
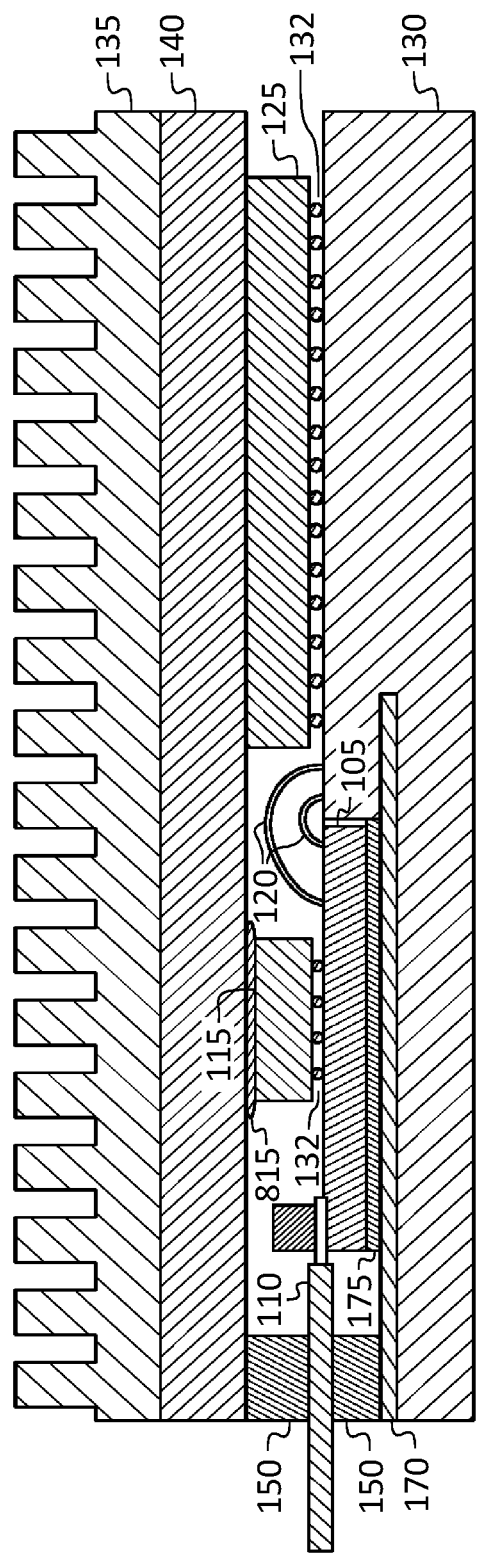
FIG. 10 is a schematic cross-sectional view of a portion of an optoelectronic module, according to an embodiment of the present disclosure.

FIG. 10 shows an embodiment similar to that of FIG. 9, in which an analog ASIC 115 is present, and the digital ASIC 125 does not overhang the pocket, but is connected by a flip chip array 132 to the substrate 130. The analog ASIC 115 is connected to the top surface of the PIC 105 by a flip chip array 132 and to the digital ASIC 125 through (i) the flip chip array 132 connecting the analog ASIC 115 to the PIC 105, (ii) conductive traces on the PIC 105, (iii) wire bonds 120 connecting the PIC 105 to the substrate 130, and (iv) the flip chip array 132 connecting the substrate 130 to the digital ASIC 125. The top surface of the analog ASIC 115 may be slightly lower than the top surface of the digital ASIC, as shown, so that the analog ASIC does not prevent the top surface of the digital ASIC from making mechanical contact with (and being in good thermal contact with) the lid. The gap between the top surface of the analog ASIC and the lid may be filled with a compliant thermal pad 815.

In some embodiments a laser chip may be installed on each of the transmitting PICs (e.g., the laser may be flip-chipped on the transmitting PIC, so that a waveguide on the laser chip is aligned with a waveguide on the transmitting PIC). In embodiments with a heater 165, current to the laser may be supplied through conductors running parallel to those for the heater 165.

Although exemplary embodiments of an optoelectronic module package have been specifically described and illustrated herein, many modifications and variations will be apparent to those skilled in the art. Accordingly, it is to be understood that an optoelectronic module package constructed according to principles of this invention may be embodied other than as specifically described herein. The invention is also defined in the following claims, and equivalents thereof.

What is claimed is:

1. An optoelectronic module, comprising:
   a substrate;
   a digital integrated circuit, on an upper surface of the substrate;
   a frame, secured in a pocket of the substrate, the pocket being in a lower surface of the substrate opposite to the upper surface of the substrate, the frame comprising a first part entirely in the pocket and a second part extending from the first part, the substrate overlapping the entire first part and not overlapping the second part;
   a photonic integrated circuit; and
   an analog integrated circuit, connected to the photonic integrated circuit, and to the digital integrated circuit, the analog integrated circuit being connected to the digital integrated circuit through the substrate,
   the frame being composed of a material having a thermal conductivity greater than 10 W/m/K,
   the substrate comprising:
     an insulating layer; and
     a plurality of conductive traces, and
   the digital integrated circuit being connected to conductive traces in the substrate through a first array of contacts.

2. The optoelectronic module of claim 1, wherein the substrate further comprises a copper layer on a surface of the pocket parallel to the lower surface of the substrate.

3. The optoelectronic module of claim 1, further comprising a carrier secured to an upper surface of the frame,
   the photonic integrated circuit and the analog integrated circuit being secured to an upper surface of the carrier,
   the carrier comprising an insulating layer and a plurality of thermal vias forming a thermal path from the analog integrated circuit to the frame.

4. The optoelectronic module of claim 3, wherein:
   the photonic integrated circuit is connected to the analog integrated circuit by first wire bonds, and
   the analog integrated circuit is connected to the substrate by second wire bonds.

5. The optoelectronic module of claim 4, further comprising a heater, in or on the photonic integrated circuit, wherein a total thermal conductivity between the photonic integrated circuit and the frame is less than 10 mW/K.

6. The optoelectronic module of claim 4, further comprising a heater patterned in metal traces on the carrier.

7. The optoelectronic module of claim 1, further comprising an optical fiber, wherein:
   the photonic integrated circuit has a V-groove, and
   an end of the optical fiber is in the V-groove.

8. The optoelectronic module of claim 1, further comprising a carrier secured to an upper surface of the frame,
   the optoelectronic module comprising an optoelectronic subassembly comprising:
     the photonic integrated circuit;
     the analog integrated circuit;
     the carrier; and
     an optical fiber, coupled to an optical waveguide on the photonic integrated circuit,
   the optoelectronic subassembly having a plurality of contact pads for establishing electrical connections between the analog integrated circuit and test equipment probes, the optoelectronic subassembly being configured to be separately testable by supplying power to the optoelectronic subassembly through one or more of the contact pads and sending data to and and/or receiving data from the optoelectronic subassembly through one or more of the contact pads.

9. The optoelectronic module of claim 1, wherein the digital integrated circuit is secured to the substrate by the first array of contacts, and the lower surface of the substrate has a second array of contacts.

10. The optoelectronic module of claim 9, wherein the second array of contacts has a coarser pitch than the first array of contacts.

11. The optoelectronic module of claim 10, further comprising a lid, on, and in thermal contact with, an upper surface of the digital integrated circuit, the lid comprising a material having a thermal conductivity of at least 10 W/m/K.

12. An optoelectronic module, comprising:
    a substrate;
    a digital integrated circuit, on an upper surface of the substrate; and
    a frame, secured in a pocket of the substrate, the pocket being in a lower surface of the substrate;
    a carrier secured to an upper surface of the frame;
    a photonic integrated circuit secured to an upper surface of the carrier;
    an analog integrated circuit secured to the upper surface of the carrier; and
    a heater in or on the photonic integrated circuit, wherein a total thermal conductivity between the photonic integrated circuit and the frame is less than 10 m W/K,
    the photonic integrated circuit being connected to the analog integrated circuit by first wire bonds,
    the analog integrated circuit being connected to the substrate by second wire bonds, connected to the photonic integrated circuit, and connected to the digital integrated circuit,
    the frame being composed of a material having a thermal conductivity greater than 10 W/m/K,
    the substrate comprising:
      an insulating layer, and
      a plurality of conductive traces,
    the carrier comprising an insulating layer, a plurality of thermal vias forming a thermal path from the analog integrated circuit to the frame, and a plurality of conductive traces,
    the heater being connected to the carrier by third wire bonds, and
    the carrier being connected to the substrate by fourth wire bonds.

13. An optoelectronic module, comprising:
    a substrate;
    a digital integrated circuit, on an upper surface of the substrate;
    a frame, secured in a recess of the substrate, the recess being in a lower surface of the substrate opposite to the upper surface of the substrate and extending part way through the substrate from the lower surface of the substrate towards the upper surface of the substrate, the substrate overlapping the recess;
    a photonic integrated circuit; and
    an analog integrated circuit, connected to the photonic integrated circuit, and to the digital integrated circuit, the analog integrated circuit being connected to the digital integrated circuit through the substrate,
    the frame being composed of a material having a thermal conductivity greater than 10 W/m/K,
    the substrate comprising:
      an insulating layer; and
      a plurality of conductive traces, and the digital integrated circuit being connected to conductive traces in the substrate through a first array of contacts.

\* \* \* \* \*